United States Patent
Bandera et al.

(10) Patent No.: US 8,048,709 B2
(45) Date of Patent: Nov. 1, 2011

(54) PHOTOVOLTAIC PANEL, RELATIVE PRODUCTION PROCESS AND PLANT FOR CARRYING OUT SUCH A PROCESS

(75) Inventors: Franco Bandera, Busto Arsizio (IT); Enrico Venegoni, Busto Arsizio (IT); Giovanni Della Rossa, Olgiate Olona (IT); Roberto Cal, Fino Mornasco (IT)

(73) Assignee: Costruzioni Meccaniche Luigi Bandera S.p.A., Busto Arsizio (Varese) (IT)

( * ) Notice: Subject to any disclaimer, the term of this patent is extended or adjusted under 35 U.S.C. 154(b) by 0 days.

(21) Appl. No.: 12/991,814

(22) PCT Filed: May 15, 2009

(86) PCT No.: PCT/IB2009/005728
§ 371 (c)(1),
(2), (4) Date: Nov. 9, 2010

(87) PCT Pub. No.: WO2009/141726
PCT Pub. Date: Nov. 26, 2009

(65) Prior Publication Data
US 2011/0059569 A1    Mar. 10, 2011

(30) Foreign Application Priority Data

May 20, 2008   (IT) .............................. MI2008A0927

(51) Int. Cl.
| | |
|---|---|
| H01L 21/00 | (2006.01) |
| B29C 47/12 | (2006.01) |
| A23D 1/00 | (2006.01) |
| A21C 11/00 | (2006.01) |
| A21C 3/00 | (2006.01) |

(52) U.S. Cl. ................... 438/66; 257/E31.124; 425/516
(58) Field of Classification Search ........................ None
See application file for complete search history.

(56) References Cited

U.S. PATENT DOCUMENTS

| | | | |
|---|---|---|---|
| 4,260,429 A | 4/1981 | Moyer | |
| 4,479,027 A | 10/1984 | Todorof | |
| 5,380,479 A * | 1/1995 | Schrenk et al. | ............... 264/241 |
| 6,184,057 B1 | 2/2001 | Van Andel et al. | |
| 2004/0079407 A1* | 4/2004 | Sharp | ......................... 136/236.1 |

* cited by examiner

*Primary Examiner* — Ha Tran T Nguyen
*Assistant Examiner* — Valerie N Brown
(74) *Attorney, Agent, or Firm* — Notaro, Michalos & Zaccaria P.C.

(57) ABSTRACT

A photovoltaic panel made by direct co-extrusion of a plurality of superimposed polymeric layers and a plant for carrying out such a process.

14 Claims, 7 Drawing Sheets

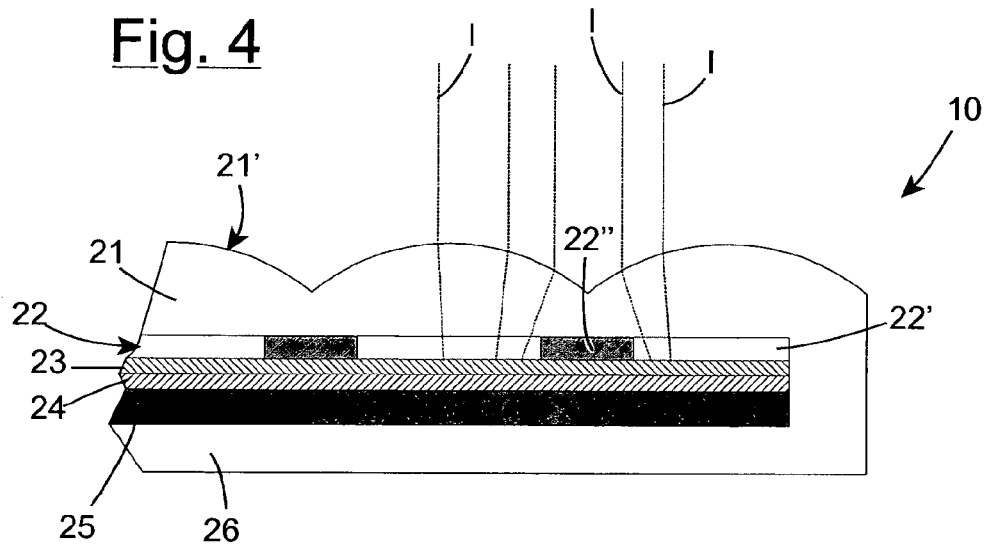
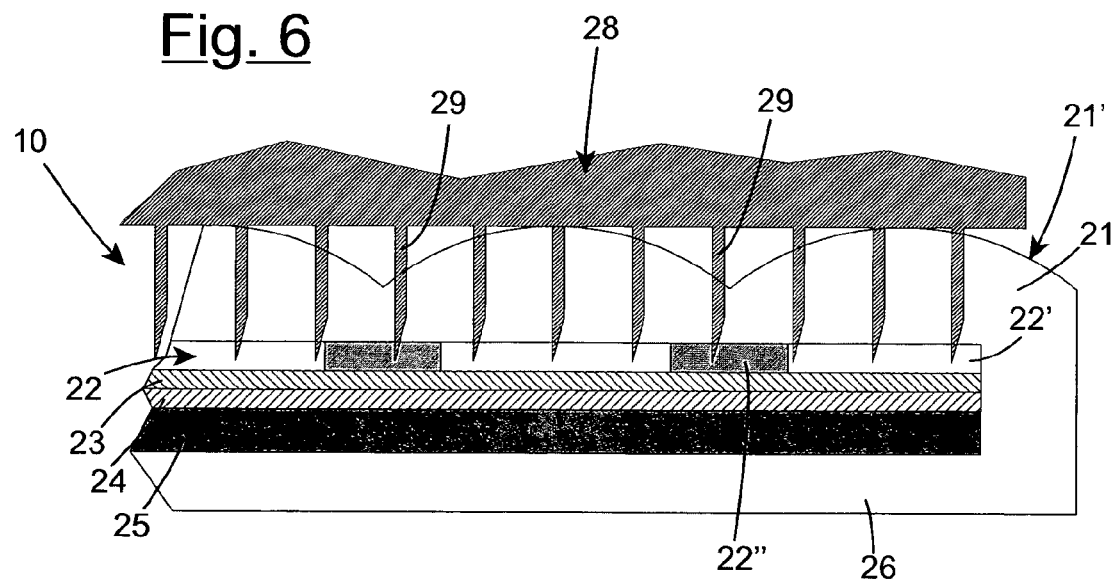

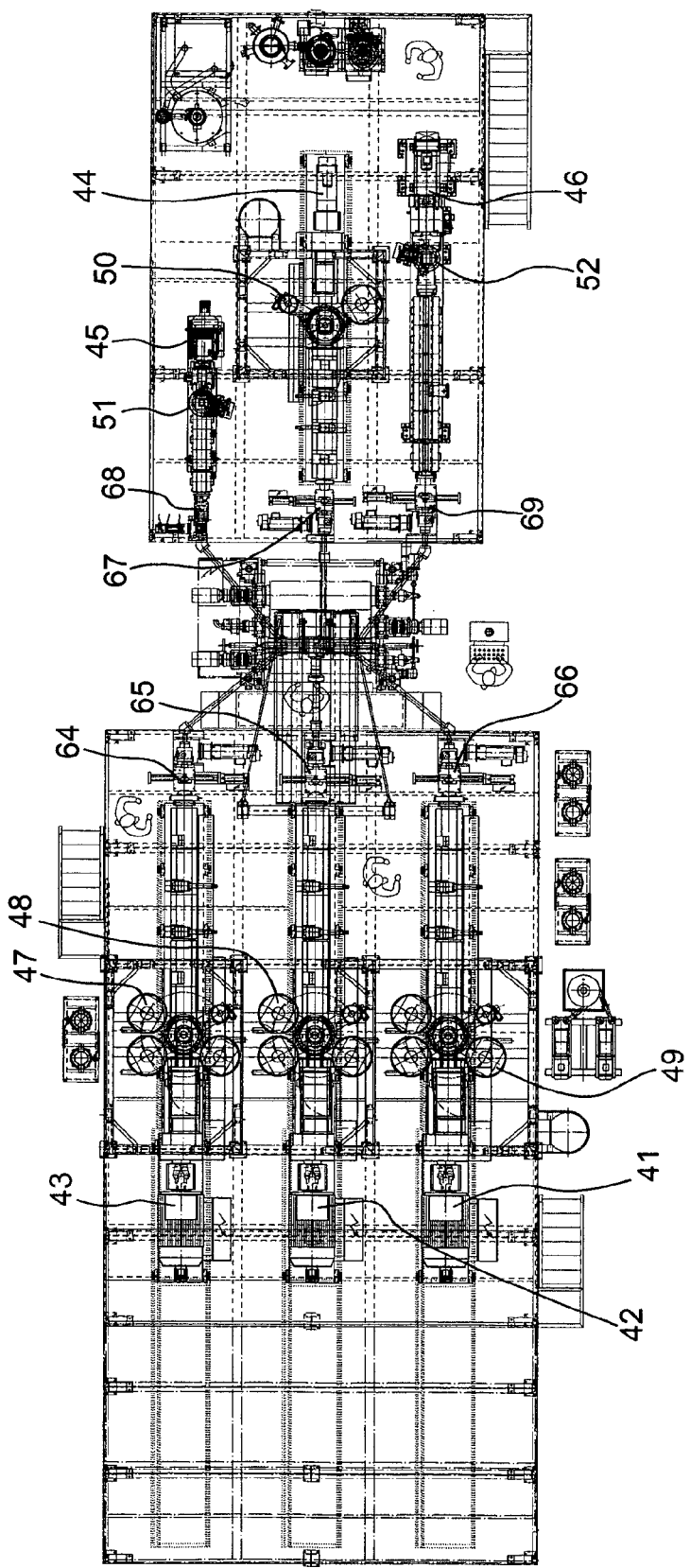

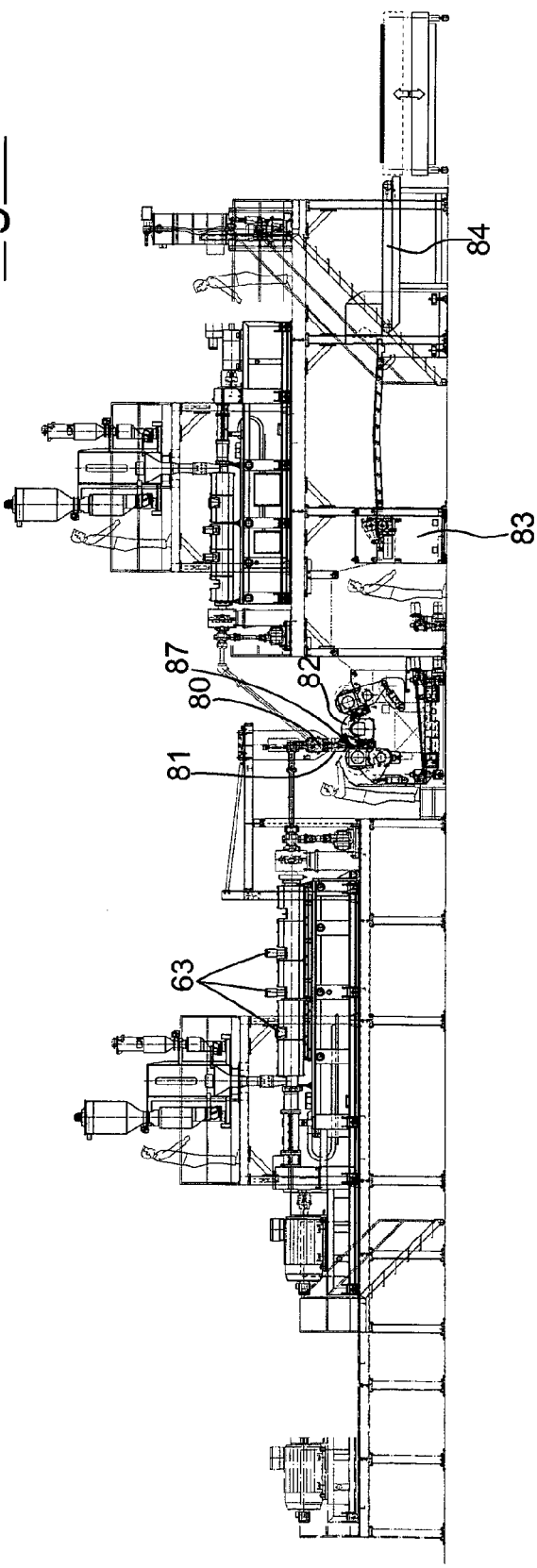

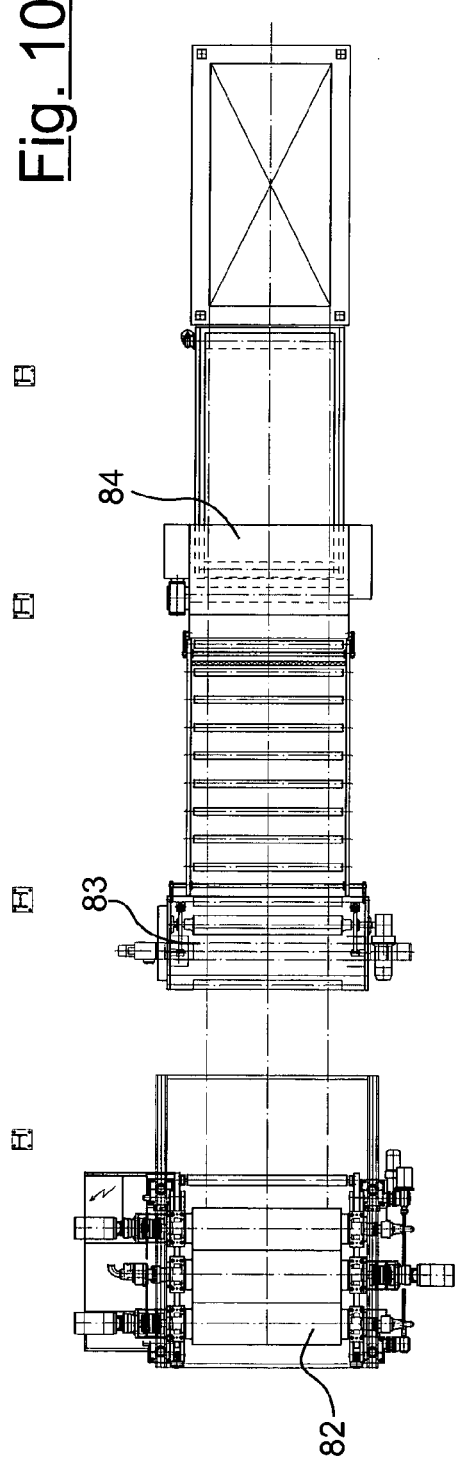
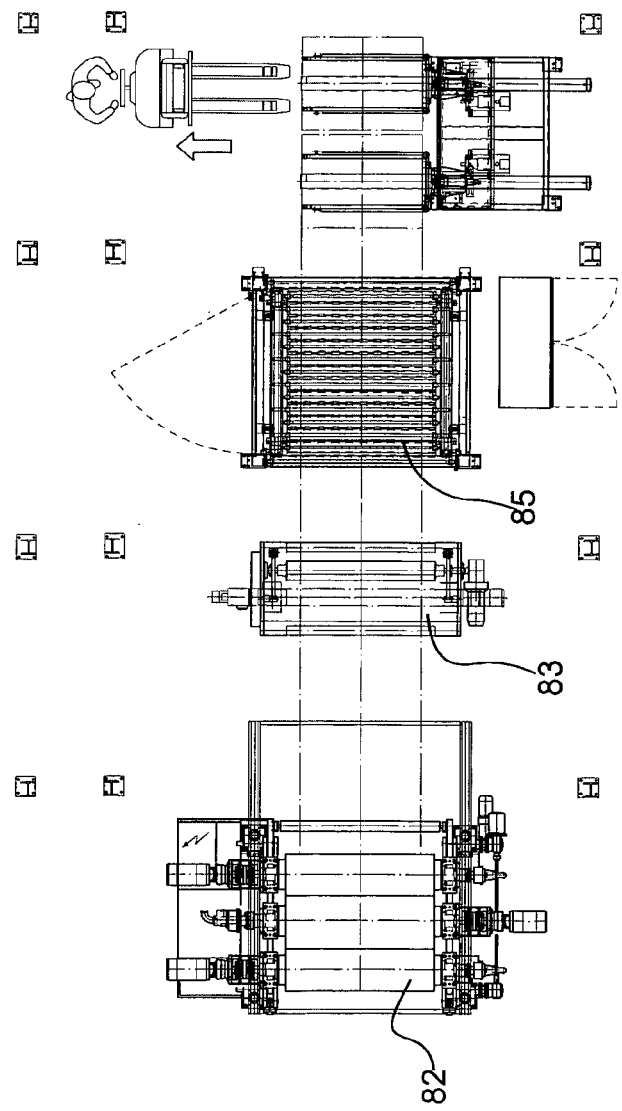

PHOTOVOLTAIC PANEL, RELATIVE PRODUCTION PROCESS AND PLANT FOR CARRYING OUT SUCH A PROCESS

FIELD AND BACKGROUND OF THE INVENTION

The present invention refers to a photovoltaic panel, to the relative production process and to a plant for carrying out such a process.

Awareness of environmental problems connected with current main sources of energy (petrol, natural gas, coal, uranium) and the consciousness of their progressive depletion have pushed towards the research and exploitation of alternative sources over the last decade.

Amongst these, photovoltaic power generation seems to be the least intrusive for producing electromotive force and is applied already today by exploiting the properties of silicon.

The operation of a photovoltaic panel is based upon the homonymous effect which occurs when an electron in the valence band of a (generally semiconductive) material passes to the conduction band due to the absorption of a sufficiently energetic photon, incident on the material.

In particular, when a luminous flux on the other hand, hits a crystal lattice of a semiconductive material, a certain number of electrons are elevated to the conduction band corresponding to the same number of holes which pass to the valence band. In this way charge carriers are made available and can be used to generate current.

The photovoltaic panel is therefore made by placing a material which by atomic structure attracts electrons (and takes on negative charge) in contact with a material which tends to repel them (and takes on positive charge) thus obtaining an n type structure (with an excess of electrons) and a p type structure (with an excess of holes), respectively.

In both of the aforementioned materials, the electrical conduction must normally be stopped, but it must be easily activated by feeding energy to the valence electrons (characteristic of semiconductors) through photon radiation.

When an electron receives a sufficient amount of energy, it begins to move in the semiconductive material leaving the place it occupied empty (electron hole) that will be filled by adjacent electrons, generating a behavior similar to that of a positively charged moving particle.

Due to the contact between the two materials having different electrical affinity, the electron will tend to shift in a preferential direction generating an electric current (the corresponding hole shifts in the opposite direction) which can be collected by conductors and advantageously used.

Only if the electron-hole pair reaches the junction between the two semiconductors is it definitively disassociated and it generates electrical current. In general, a photovoltaic generator structure according to the prior art comprises, in the order illustrated in FIG. 1:

a first protective layer 1;
a conductive layer for collecting electrons (negative pole) 2;
a negative semiconductive layer 3 ($n$);
a positive semiconductive layer 4 ($p$);
a conductive layer 5 for collecting electron holes (positive pole); and
a second protective layer 6.

The photovoltaic panel illustrated in FIG. 1 has therefore the first protective layer 1 in glass, the conductive layer 2 in turn made through a metallic mesh 2' embedded in a transparent conductive layer 2". The p and n semiconductive layers 3 and 4 respectively are conventionally made through "doped" silicon respectively with elements of group III and V of the periodic system of elements.

Since the photons must reach the semiconductor, at least one of the protective layers and the adjacent conductive layer must be transparent to light.

The conventional photovoltaic cells use silicon doped, for example, with boron and phosphorus to make the two active intermediate layers (semiconductors) and conventional metal conductors for the most outer layers. One of the two conductive layers is formed by a metallic wire net to allow silicon to be illuminated.

In the conventional production process, the silicon foil (wafer) is obtained by slicing a suitably pure ingot, later doped by diffusion in high temperature ovens and assembled with the different layers that form the cell.

The process is costly and laborious and justified only in view of environmental and strategic reasons, obtaining institutional incentive for this reason or due to the lack of other energy sources.

In order to optimize the use of silicon and make the production process more cost effective, technologies have been developed in which the various components are obtained by deposition of thin films (of the order of nanometers nm, or of micrometers μm).

The silicon thus obtained is amorphous; it has a shorter life and a lower yield than the crystalline silicon of the wafers, but the reduction in cost makes up for the drawbacks.

Solutions using "conjugated structure" polymers, that is polymers in which the carbon atom chain C, contains at least partially regular configurations of double covalent bonds (σ, π), have been proposed and in some cases made.

In these polymers, the electron forming the bond π is, according to the most accredited model, delocalized in an electron cloud surrounding the molecule and can easily be excited to the conduction band generating a pair (electron-hole).

The particular chemical composition and/or the presence of suitable doping elements, gives the polymer the property of being an electron-donor (like in the case of poly (2-methoxy, 5-(2'-ethyl-hexyloxy)-1, 4-phenylene vinylene) (MEH-PPV)) or an electrons acceptor (like in the case of [6, 6]-phenyl-C61-butyric acid methyl ester (PCBM)) allowing photovoltaic semiconductive pairs to be created.

Examples of photovoltaic cells made with conductive polymers are described in technical/literature and/or form patent prior art.

For example, cells are known comprising the following layers:
ITO/PBI/P3HT/Au, (ITO: Indium Tin Oxide; the rear electrode is a thin gold film);
PEDOT: PSS/MEH-PPV/PCBM/Al (PEDOT: PSS conductive polymer; and
Polyethylenedioxythiophene/polystyrenesulfonate, the rear electrode is made of aluminum).

One of the conductors must be transparent in order to allow the semiconductive films to be irradiated.

Currently, ITO (ITO: Indium Tin Oxide) is used.

A suitable electron collecting system must then be associated with this, normally a small-meshed wire net of copper with thin wires.

All of this is closed between protective films to avoid the components from oxidizing. Organic or metal materials are normally used.

These polymers however, cannot withstand high temperature transformation processes, customary for common plastic materials, they have a relatively low energy yield and a relatively short life (always compared to silicon).

The possibility of making solar cells with cheaper procedures and even with continuous processes is a constant goal of the scientific community and industry.

According to the prior art different proposals can be found, for example:

U.S. Pat. No. 4,260,429, concerns a transparent electrode formed by embedding a metallic wire net in a charged polymer, typically a fluoropolymer charged with elements according to the semiconductive type it is to be coupled with:

for Silicon (Si), the conductive particles are Au/Si, Au/Ge, Ge, Al/Si, Al;

for Gallium Arsenide (GaAs), the conductive particles are Au/Ge, Au/Sn, Sn;

for Cadmium Sulphide (CdS) the conductive particles are In, Nb, Ni, Ti/Al, Hg; and for Copper Sulphate $Cu_2S$ the conductive particles are Au, graphite, Cu, conductive Carbon Black, Pb/Sn.

According to U.S. Pat. No. 4,479,027 a photovoltaic film is obtained by laminating and coupling metallic and ceramic Silicon-based strips.

U.S. Pat. No. 6,184,057 B1 teaches a production process of a photosensitive film obtained through successive deposition of layers.

In a publication by Zhang et al. of 2002, a film is proposed made through successive depositions PEDOT:PSS/MEH-PPV/PCBM/Al (aluminum cathode deposited through vaporization) having high flexibility.

There are also partial solutions to make or optimize parts of the cell.

Glass is the conventional solution for protecting photovoltaic cells on the side exposed to solar radiation. However it does have limited mechanical characteristics.

More resistant alternatives are:

Polycarbonate (PC) (it has low weatherability and is oxygen permeable)

Polyvinyl fluoride (PVF) (DuPont); and

Ethylene/tetrafluoroethylene copolymer (ETFE) (DuPont).

The rear protection can be made from a metal support but solutions involving single or multilayered polymers or polymeric blends have also been proposed:

multilayer PVF/ETFE/PVF;

single layer or multilayer PA (polyamide), PET (polyethylene terephthalate), PTFE (polytetrafluoroethylene);

multi-layer PC (polycarbonate) and fluorinated polymers, possibly with addition of an EVA (Ethylene-vinyl acetate) layer (BASF); and PA (polyamide)/ionomers mixture (DuPont).

The processes described in literature for making the active part of a photovoltaic cell, that is the layers in which light radiation is converted into electrical potential difference, are carried out:

through deposition following vapour condensation by direct synthesis on the support (chemical reaction);

through condensation of a solution through removal of the solvent and depositing of the solute;

through deposition following printing (ink jet, lithography or others); and through electrodeposition on a conductive substrate.

The procedures currently known, relative to the layers that form the entire cell (electrodes, semiconductors, protection, and similar) alternatively or in combination foresee:

the subsequently deposition of the layers through total or partial coating of the layers previously created; and the preparation of semi-finished products subsequently coupled by lamination.

SUMMARY OF THE INVENTION

The applicant has therefore felt the need to avoid the problems of excessive production costs of the photovoltaic panels and to obtain cost-effective panels which are possibly flexible and able to be rolled up, through a simplified process.

The applicant has been able to solve the aforementioned technical problem by providing a production process of a photovoltaic panel according to the invention as disclosed herein and a plant for making a photovoltaic panel according to the invention as disclosed herein.

The invention and further characteristics thereof are defined in the claims appearing at the end of this disclosure.

BRIEF DESCRIPTION OF THE DRAWINGS

The characteristics and advantages of the photovoltaic panel, of a process for producing said panel and of the plant for making it, according to the present invention, shall become clearer from the following description, given as an example and not for limiting purposes, referring to the attached schematic drawings in which:

FIG. 4 illustrates a schematic section view of a photovoltaic panel obtained according to the embodiment of FIG. 3 in a variant embodiment of the present invention;

FIG. 6 illustrates a schematic section view of a photovoltaic panel of FIG. 4 in a further different variant embodiment.

FIG. 7 illustrates a plan view from above of the plant for carrying out the process according to the invention;

FIGS. 8 and 9 illustrate schematic side elevation views of two embodiments of the plant for carrying out the process according to the invention; and FIGS. 10a and 10b illustrate plan views from above of a lower portion of the two embodiments of the plant according to the invention illustrated in FIGS. 8 and 9, respectively.

DESCRIPTION OF THE PREFERRED EMBODIMENTS

Figure 1:
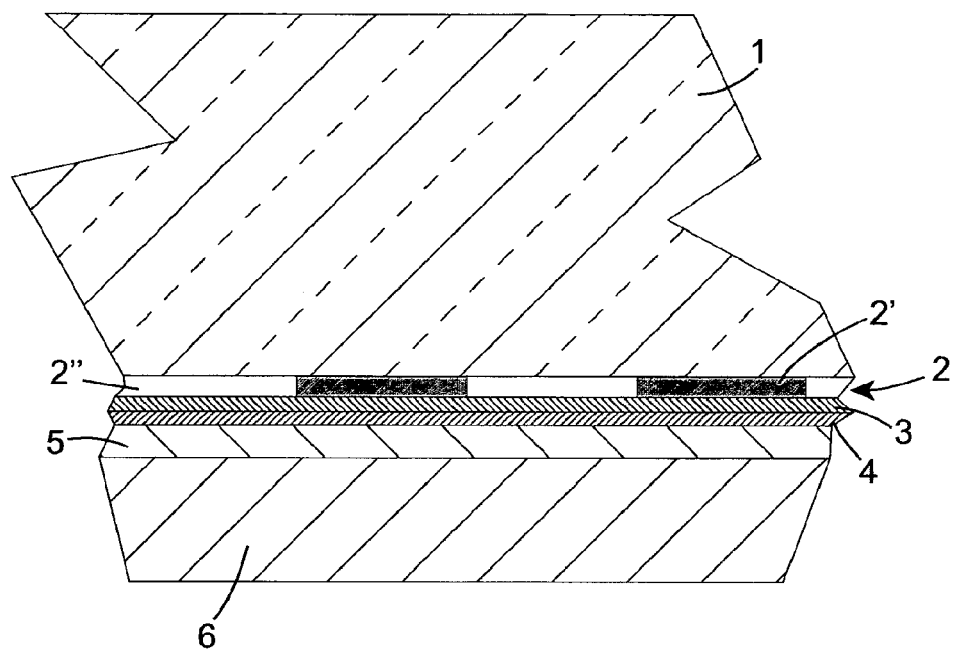
FIG. 1 illustrates a schematic section view of a photovoltaic panel according to the prior art.
Figure 2:
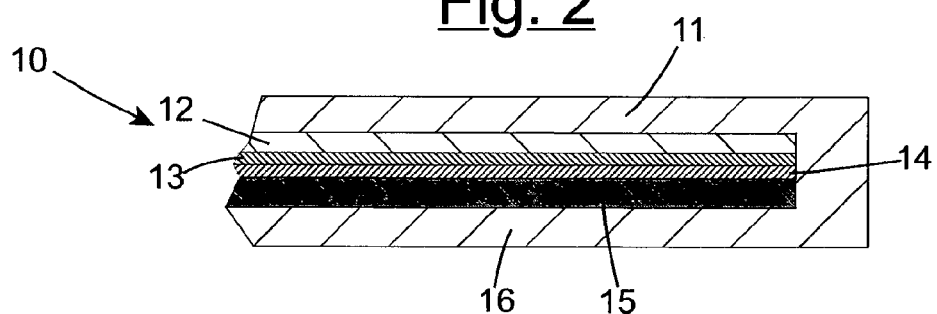
FIG. 2 illustrates a schematic section view of a photovoltaic panel made according to the present invention.

With reference to FIGS. 2 to 6 a photovoltaic panel 10 according to the invention comprises a first protective transparent polymeric layer 11, a transparent polymeric conductive layer 12, a negative n-type active layer 13, a positive p-type active layer 14, a conductive polymeric layer 15 and a second protective layer 16, said layers 11-16 being made and intimately coupled through direct co-extrusion.

The first and second protective polymeric layers 11 and 16 are made through one or more polymers selected from amorphous PET, Polyolefins, PMMA, PC, polystyrene, polyester, polyamide; at least the first protective polymeric layer 11 or both protective layers 11 and 16 can be made transparent according to whether the illumination is foreseen on only one side or on both sides of the photovoltaic panel 10.

According to the thickness, the flat products are classified in films, sheets or plates. In the present description the finished product is indicated as a multilayer panel or sheet and is formed by a plurality of layers of any thickness technologically able to be used to make photovoltaic panels.

To make the first protective layer 11 the following are advantageously used:
- Polycarbonate (PC) (it has low weatherability and is oxygen permeable);
- Polyvinyl fluoride (PVF) (DuPont); and
- Ethylene/tetrafluoroethylene copolymer (ETFE) (DuPont).

The rear protection obtained through the second polymeric layer can be made with a metal support but solutions involving single or multilayered polymers or polymeric blends are also proposed:
- multilayer PVF/ETFE/PVF;
- single layer or multilayer PA (polyamide), PET (polyethylene terephthalate), PTFE (polytetrafluoroethylene);
- multilayer PC (polycarbonate) and fluorinated polymers, possibly with addition of an EVA (Ethylene-vinyl acetate) layer (BASF); and
- PA (polyamide)/ionomers mixture (DuPont).

Polymers with suitable photovoltaic properties and which are able to be processed by extrusion allow a co-extruded multilayer electromotive force generator to be produced.

Starting from existing solutions it is possible to hypothesize the use of organic transparent conductors obtained by suitably doping extrudable polymers with fillers or nanofillers thus obtaining products with properties similar to PEDOT: PSS.

Although such a solution can be hypothesized and contemplated here, the need to keep down costs encourages considering the use of classic polymers made into conductors by adding fillers such as metal fibers or carbon black.

Since these fillers make the polymer opaque, in order to allow the active layers to be irradiated, the electrode must be made in strips on the illuminated face.

Two configurations are possible and in both of them the photovoltaic panel 10 is made through direct co-extrusion of the following layers which are superimposed in intimate contact and stuck together. According to a first embodiment, illustrated in FIG. 2, the photovoltaic panel 10 has:
- a first transparent protective layer 11 made from one or more materials selected from amorphous PET, Polyolefins, PMMA, PC, Polyvinyl fluoride, ethylene\tetrafluoroethylene copolymer;
- a transparent conductive polymer layer 12, which is conductive by chemical nature or through added fillers or nanofillers;
- a negative n-type semiconductive active layer 13, made from a material that is photoactive due to the chemical nature of the polymer or due to the presence of photoactive fillers or nanofillers;
- a positive p-type semiconductive active layer 14, made from a material that is photoactive due to the chemical nature of the polymer or due to the presence of photoactive fillers or nanofillers;
- a conductive polymer layer 15, possibly transparent if illumination on both sides of the photovoltaic multilayer is foreseen, made from a conductive polymer due to the presence of conductive radicals or chemical structures in the molecule or through the addition of fillers or nanofillers; and
- a second protective polymeric layer 16, possibly transparent made in the form of a single layer or multi-layer or polymeric blend with materials selected from amorphous PET, Polyolefins, PMMA, PC, polystyrene, polyester, polyamide, multilayer PVF/ETFE/PVF, single layer or multi-layer PA (polyamide), PET (polyethylene terephthalate), PTFE (polytetrafluoroethylene), multilayer PC (polycarbonate) and fluorinated polymer, possibly with an addition of an EVA (ethylene vinyl acetate) layer, PA (polyamide)/ionomer mixture.

The selection of the polymer with which to make the protective layer depends upon the selection of the conductive and semiconductive polymers.

The arrangement of the layers 13 and 14 can be inverted according to the characteristics of the semiconductive polymers used.

Figure 3:
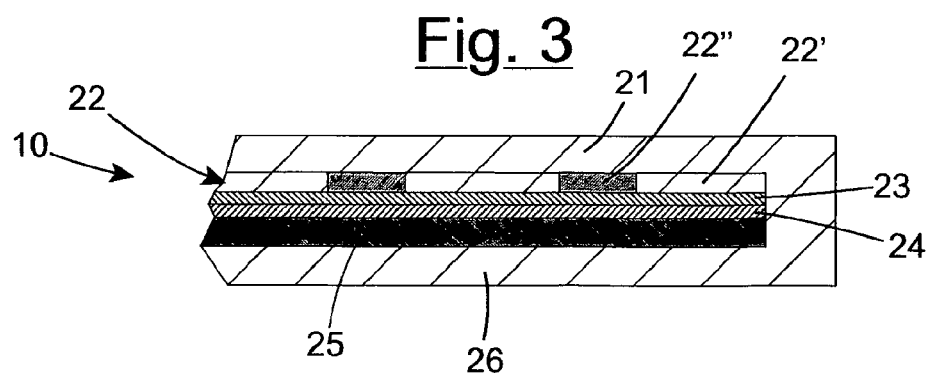
FIG. 3 illustrates a schematic section view of a photovoltaic panel obtained according to a different embodiment of the present invention.
Figure 5:
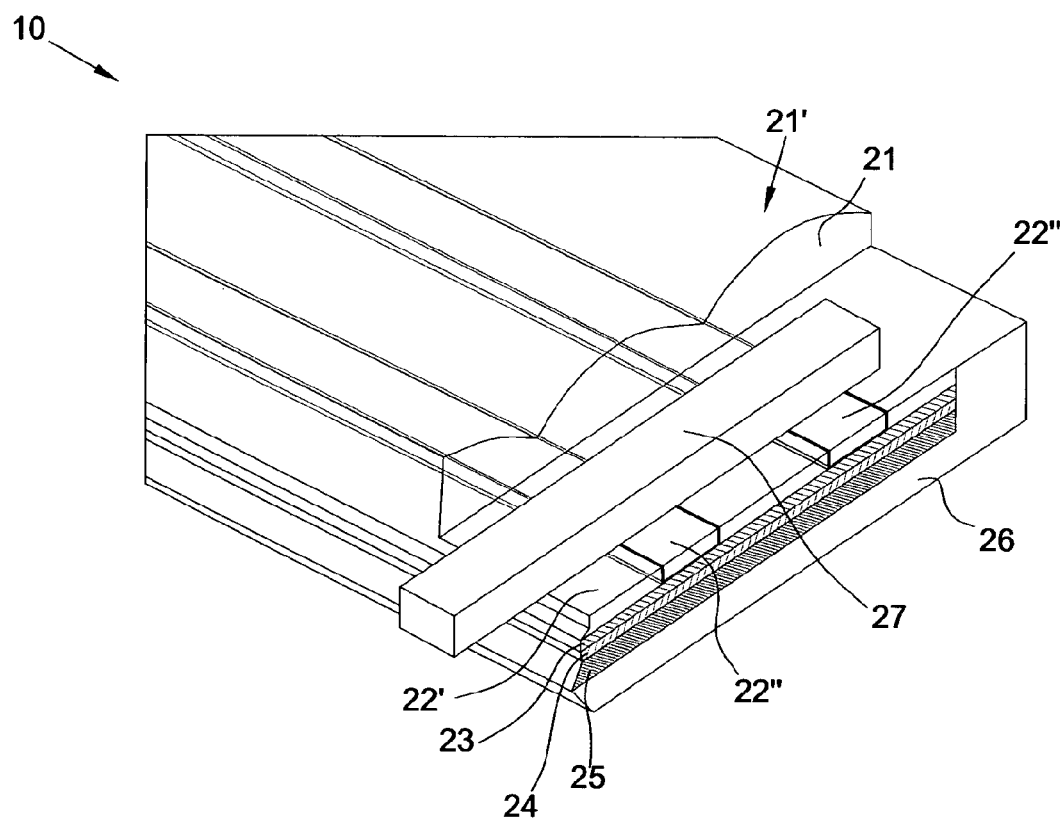
FIG. 5 illustrates a partially sectioned perspective view of the photovoltaic panel of FIG. 4 in a different variant embodiment.
Figure 9:
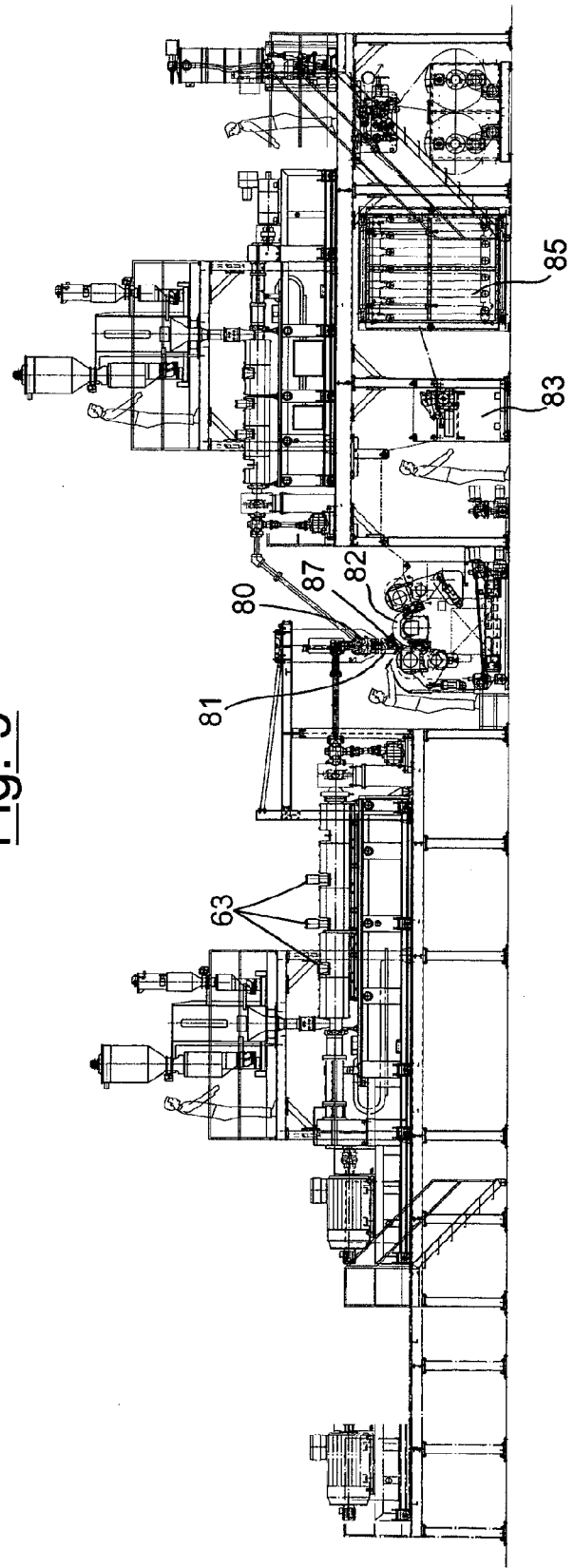

In a second embodiment of the invention, illustrated in FIG. 3, the photovoltaic panel is made through the following layers:
- first transparent protective layer 21 made from a material selected from amorphous PET, Polyolefins, PMMA, PC, Polyvinyl fluoride, ethylene\tetrafluoroethylene copolymer;
- first conductive polymer layer 22 made through alternated strips of transparent polymer 22', like the first transparent protective layer 21, and the conductive polymer 22". The polymer 22" is conductive by its chemical nature or through the addition of fillers or nanofillers, for example, metal or graphite which normally make the strip of conductive polymer opaque;
- negative n-type active layer 23, made from a material that is photoactive due to the chemical nature of the polymer or due to the presence of photoactive fillers or nanofillers;
- positive p-type active layer 24, made from a material which is photoactive due to the chemical nature of the polymer or due to the presence of photoactive fillers or nanofillers;
- second layer of conductive polymer 25 made in an opaque layer or possibly, in order to allow both sides to be illuminated, through alternating strips of transparent polymer like the first transparent protective layer 21 and polymer that is conductive by its chemical nature or through the addition of fillers, for example, metal or graphite which normally make the strip opaque or due to the presence of conductive radicals or chemical structures in the molecule or through the addition of fillers or nanofillers; and
- second protective layer 26, possibly transparent made in the form of single layer, multilayer or polymeric blend with materials selected from amorphous PET, Polyolefins, PMMA, PC, polystyrene, polyester, polyamide, multilayer PVF/ETFE/PVF, single layer or multilayer of PA (polyamide), PET (polyethylene terephthalate), PTFE (polytetrafluoroethylene), multilayer PC (polycarbonate) and fluorinated polymer, possibly with an addition of an EVA (ethylene vinyl acetate) layer, PA (polyamide)/ionomer mixture.

Also in this case, the choice of material from which to make the protective layer depends on the choice of conductive and semiconductive polymers.

According to the production needs and to the sizes, the protective layers 11 and 16 or 21 and 26 can also be joined along one or along both sides of the panel.

The arrangement of the layers 23 and 24 can be inverted according to the properties of the semiconductive polymers used.

In order to compensate for the shadow zone on the active layers 23 and 24; (semiconductors), generated by the opaque conductive polymer, the outer surface 21' of the first transparent protective layer can be suitably undulated, like in FIGS. 4-6, so as to concentrate the incident radiation I on the semiconductive polymer.

Multilayer panels with this structure are cheap to make with thicknesses of between 200 μm and 2 mm and the thickness of the single layers forming the panel is of between 10 μm and 1 mm.

The width of the multilayer panel depends on the required productivity. A reasonable field is between 500 mm and 2000 mm.

The thicknesses must be determined according to the processing properties of the active polymers based upon which suitable conductive and encapsulating polymers are selected.

For polymers that are photovoltaic thanks to fillers or nanofillers, dispersion can advantageously be carried out directly during production.

For the version which uses opaque conductive polymers, the connection of the upper conductive strips, and possibly also of the lower ones (not illustrated) made if the rear of the panel is also to be illuminated, can be made through one of the following methods:

removal of the first protective layer 21 (FIG. 5) and gluing of a metallic strip 27 onto the exposed conductive terminals of the strips 22" of conductive polymer (and analogously with different metal strip on the lower strips); and use of a metal comb 28 (FIG. 6) pushed from outside, so that the comb teeth 29 pass through the first protective layer 21 and reach the conductive polymer strips 22' (and analogously with a different comb suitable for meeting the strips of the second conductive polymer).

The manufacture of directly co-extruding layers of polymeric material (plastic), according to the invention, foresees the following steps:

a) plasticizing the polymers in dedicated machines. Industrially, single screw, twin screw or multi screw extruders are used. Each polymer requires its own extruder, set with its own process parameters and it can produce one or more layers in the finished product. Plasticizing gives the polymer the necessary conditions to be able to be easily transported in variable sectioned ducts and coupled with other polymers. Plasticizing consists of increasing the energy inside the material through heating or visco-plastic dissipation of mechanical work until a temperature is reached at which the viscosity is low enough for subsequent manipulation as a fluid. In the case in which it is foreseen to form mixtures of polymers or to add additives, colouring fillers, the distribution and the homogenization of the compound is carried out in this step;

b) transporting the plasticized polymer through ducts to the stratification group. This process can require special provisions in order to avoid the components from demixing.

c) stratifying the different polymers (coming from the different extruders used). The polymers are arranged and coupled in the order in which they will be arranged in the end product, with flow rates which respect the foreseen thickness and mass ratios. Due to laminar flow regime (very low Reynolds number), the duct conformation and the different chemical nature of the polymers, they do not mix during the subsequent transport but form a heterogeneous stratified flow.

d) extruding, the flow made up of the different polymers is pushed through a die which is rectangular (cast films, flat films) or tubular (blow films) of a suitable thickness. The different materials adapt to the channel forming distinct but intimately coupled layers;

e) consolidating the product, generally through cooling, until a multi-layer sheet is formed thick enough to be manipulated (rolled up, cut, moved around in normal industrial conditions). Based upon the process type, the consolidation is carried out through contact with cooled rollers (cast film, chill roll, calendaring) or through air (blow film) or through contact with cooled shaped calibrators (flat, shaped or alveolar plate calibration).

By varying the preselected technology it is possible to make products with thickness of a few tens of μm to a few mm with a number of layers which can also reach about ten.

It is also possible to limit the width of one or more layers by regularly alternating different materials within the same thickness, obtaining longitudinal strips in the multi-layer.

To make these products, suitable distribution nozzles made like a comb which release calibrated quantities of polymer in the points where the longitudinal strip needs to be made, are inserted in the extruder head.

In cast, chill roll and calendaring technologies, the layer solidifies in contact with a surface. Its surface finishing depends on the roughness and on the possible incision present on the surface.

With this technique, it is therefore possible to make the surface undulation of the transparent layer in order to concentrate the radiation which would otherwise be dispersed on the opaque area of the underlying conductive layer.

According to the desired final product, the multi-layer is made with suitable flexibility or stiffness in order to be manipulated respectively in the form of rolled up reels or panels on pallets.

The general structure of a plant for carrying out the extrusion process of a photovoltaic multi-layer of polymeric material according to the present invention foresees a plurality of extruders in which the polymers are plasticized, functionalized with fillers or chemical reactions (reactive extrusion) until the processed polymer has the desired properties.

In the plant configuration according to the embodiments illustrated in FIGS. 7 to 10*b* there are the following extruders:

A first co-rotating twin screw extruder 41 for the preparation of the active layer 13, 23 of negative n-type semiconductive polymer.

A second co-rotating twin screw extruder 42 for the preparation of the active layer 14, 24 of positive p-type semiconductive polymer.

A third co-rotating twin screw extruder 43 for preparing the conductive polymer 15, 25 intended to form the electrode on the side of the cell not exposed to solar radiation.

A fourth co-rotating twin screw extruder 44 for the preparation of the conductive polymer 12, 22" for forming the layer of conductive polymer 12 or the longitudinal strips of conductive polymer 22" on the side of the cell exposed to solar radiation.

Such four extruders 41-44 have screw diameters of between 55 mm and 170 mm (according to the desired productivity) and screw lengths more than 40 times the diameter.

A fifth single screw extruder 45 has screw diameter of between 50 mm and 150 mm (according to the desired productivity) and screw length more than 30 times the diameter for the preparation of the transparent polymer intended to form the longitudinal strips of transparent polymer 22' on the side of the cell exposed to solar radiation.

Such a fifth extruder 45 can be left out if the layer of conductive polymer 12 is transparent and conductive due to its chemical nature or through added fillers or nanofillers instead of the embodiment of the conductive layer with alternated strips 21', 21".

A sixth single screw extruder 46 has screw diameter of between 100 mm and 200 mm (according to the desired productivity) and screw length more than 30 times the diameter for the preparation of transparent polymer layers 11, 21, 16, 26 intended to form the protective casing of the cell.

If the polymers processed by extruders 43 and 44 are identical, the two extruders can be replaced by a single suitably sized extruder able to simultaneously extrude both layers.

The extruders are fed by corresponding dispenser devices 47-52 able to weigh the quantity of different components that make up the recipes for making each layer.

For the twin screw extruders 41-44 dispenser devices 47-50 are used which continuously measure the flow rate detecting the weight of material contained in hoppers which feed the extruder over time.

Deriving the signal over time, they measure the instantaneous flow rate of each component.

For the single screw extruders 45, 46 dispenser devices 51-52 are used equipped with discontinuous mixing and weighing systems.

The extruders can use degassing systems 63 with one or more mouths to achieve the physical/chemical properties required from the polymers used for the different layers which form the cell.

The process temperatures correspond to those suitable for working the different polymers which form the cell.

For every extruder a corresponding dedicated group for filtering and pumping molten polymer 64-69 is foreseen.

Static mixers (not illustrated) are also inserted in the different ducts to make the properties and temperature in every single component uniform.

The different polymers are arranged in the order foreseen in the final cell by a stratification device 80.

The different components considered in pairs can be classified as compatible or incompatible. All the materials which have very close process properties (temperature, pressure, bearable strain, and similar chemical/physical properties) and suitable mutual adhesion properties in molten state, are compatible. All the other pairs that do not have such elective affinities are incompatible.

The adjacent layers of the multi-layer formed by compatible materials are placed in contact with each other directly in the stratification device 80.

The adjacent layers of the multi-layer formed by incompatible materials are kept separate also in the extruder head, which is made through a multichannel head 81 and placed into mutual contact shortly before the extrusion through a die 87.

The layer formed by longitudinal strips of different materials is made in the head area 81 which precedes the extruding die.

The combination of molten polymers arranged in the desired layers is extruded through a rectangular slot 87 (die) and is conformed (and solidified) through pressing between two adjacent thermoregulated rollers 82.

The cooling and finishing of the surfaces are controlled through the intimate contact of the sheet with the aforementioned rollers 82.

In the indicated intervals, the total productivity-varies between 500 m/h and 4000 m/h according to the sizes of the selected machines and the dimensions of the sheet.

The production speed and regularity are ensured by a drawing device 83 comprising two motorized rubber-coated rollers pressing on opposite sides of the multilayer extruded.

Downstream of the drawing device 83 two packaging systems are possible:

For multi-layer sheet of a certain stiffness it is foreseen to use, a shearing machine for cutting into panels of a determined length and to stack them onto pallets 84 (FIGS. 8, 10a).

For multi-layer sheet of a certain flexibility a system for winding into reels 85 (FIGS. 9, 10b) is foreseen.

The purposes of the invention consisting of obtaining solar cells through cost-effective production processes are thus achieved.

Since the production process forms a substantial component of the solar panel cost, the fact that the present invention enables it to be simplified and cheaper makes photovoltaic energy substantially more competitive in relation to conventional energy sources.

The main innovation contained in the present invention is the possibility of obtaining the photovoltaic cell directly by co-extrusion, therefore with a single continuous operation with low direct cost.

Another fundamental innovative aspect is the use of longitudinal strip co-extrusion for collecting the charges generated by the cell thus being able to use opaque conductive polymers, which are cheaper and easier to process than transparent conductive polymers. This is done without having to resort to intermediate steps of printing or chemical/physical deposition of such an opaque layer.

The use of undulated surfaces obtained directly in calendaring as concentrators of light rays is also innovative.

It is also possible to make a cell having longitudinal strips on both faces allowing it to be also used when it is possible to radiate both sides of the cell. By modifying the thickness and nature of the cell layers (usually the thickness of the outer protective layer or of the rear conductive layer) it is possible to make panels that are stiffer, more resistant and more manageable, or else more flexible panels, more advantageous for further processing.

The invention claimed is:

1. A process for making a multilayer photovoltaic panel (10) by direct co-extrusion of polymeric material comprising the steps of:
    a) plasticizing polymers in a plurality of different dedicated extruders for lowering the viscosity of the polymers for subsequent manipulation of the polymers as a fluid;
    b) transporting the plasticized polymers through ducts to a stratification group;
    c) stratifying the plasticized polymers coming from the plurality of different dedicated extruders so that the plasticized polymers are arranged and coupled in the order in which they will be arranged in an end product, with flow rates which respect foreseen thickness and mass ratios of the plasticized polymers;
    d) co-extruding a flow made up of the different plasticized polymers; and
    e) consolidating the flow to form the end product through cooling until a film that is sufficiently thick so as to be able to be manipulated is formed, wherein said multilayer photovoltaic panel (10) comprises a first protective transparent polymeric layer (11,21), a first at least partially transparent polymeric conductive layer (12, 22), a negative n-type semiconductive active layer (13, 23), a positive p-type semiconductive active layer (14, 24), a second conductive polymeric layer (15, 25) and a second protective polymeric layer (16, 26), said layers (11-16, 21-26) being made and intimately coupled through direct co-extrusion.

2. The process according to claim 1, wherein said negative n-type semiconductive active layer (13, 23) is made from a material which is photoactive due to the chemical nature of the polymer or due to the presence of photoactive fillers or nanofillers.

3. The process according to claim 1, wherein said positive p-type semiconductive active layer (14,24) is made from a material which is photoactive due to the chemical nature of the polymer or due to the presence of photoactive fillers or nanofillers.

4. The process according to claim 1, wherein at least one of said first and second conductive polymeric layers (12, 22; 15,25) is partially transparent and is made through alternated longitudinal strips of transparent polymer (22') and conductive polymer (22"), the longitudinal strip of conductive polymer (22") being conductive due to its chemical nature or through the addition of fillers, for example metal or graphite which make the strip opaque.

5. The process according to claim 4, further comprising the step consisting in removing a portion of said first protective layer so as to expose conductive terminals of said longitudinal conductive strips (22') and gluing a metallic strip (27) onto said conductive terminals.

6. The process according to claim 4, further comprising the step consisting in connecting said longitudinal conductive strips (22') by means of a metal comb (28) pushed from outside, so that the comb teeth (29), once passed through the first protective layer (21), meet the conductive polymer strips (22').

7. The process according to claim 1, wherein at least one of said first and second conductive polymeric layer (12, 22; 15,25) is transparent and conductive by its chemical nature or through added fillers or nanofillers.

8. The process according to claim 7, wherein said first and second conductive polymeric layer (12, 22; 15,25) are transparent and conductive by their chemical nature or through added fillers or nanofillers in order to allow both sides to be illuminated.

9. The process according to claim 7, wherein said second conductive polymeric layer (15,25) is opaque.

10. The process according to claim 1, wherein said first transparent protective layer (11, 21) is made from one or more materials selected from amorphous PET, Polyolefins, PMMA, PC, Polyvinyl fluoride, ethylene\tetrafluoroethylene copolymer.

11. The process according to claim 1, wherein said possibly transparent second protective layer (16, 26) is made as a single or multi-layer or polymeric blend with materials selected from amorphous PET, Polyolefins, PMMA, PC, polystyrene, polyester, polyamide, multi-layer PVF/ETFE/PVF, single layer or multi-layer PA (polyamide), PET (polyethylene terephthalate), PTFE (polytetrafluoroethylene), multi-layer PC (polycarbonate) and fluorinated polymer, possibly with addition of an EVA (ethylene vinyl acetate) layer, PA (polyamide)/ionomer blend.

12. The process according to claim 1, wherein said consolidating step comprises the step of finishing the outer surface of said first transparent protective layer (21) in an undulated shape, so as to concentrate the incident radiation (I) on the semiconductive polymers.

13. The process according to claim 1, comprising the step of joining said pairs of protective layers (11) and (16) or (21) and (26) along one or both sides of the panel.

14. The process according to claim 1, wherein the arrangement of said negative n-type semiconductive active layer (13, 23) and of said positive p-type semiconductive active layer (14, 24) is inverted.

* * * * *